United States Patent [19]
Kumatoriya et al.

[11] Patent Number: 6,052,042
[45] Date of Patent: Apr. 18, 2000

[54] MAGNETOSTATIC WAVE DEVICE

[75] Inventors: Makoto Kumatoriya, Omihachiman; Toshihito Umegaki, Nagaokakyo, both of Japan

[73] Assignee: Murata Manufacturing Co., Ltd., Japan

[21] Appl. No.: 09/053,466

[22] Filed: Apr. 1, 1998

[30] Foreign Application Priority Data

Apr. 10, 1997 [JP] Japan .................................. 9-110131

[51] Int. Cl.⁷ .......................... H01P 1/215; H01F 10/24
[52] U.S. Cl. ................ 333/202; 333/24.1; 333/219.2; 428/693; 252/62.57
[58] Field of Search .................................. 333/202, 204, 333/205, 219.2, 24.1; 428/628, 629, 632, 633, 642, 688, 692, 693, 966; 252/62.52, 62.57, 62.58, 62.56

[56] References Cited

U.S. PATENT DOCUMENTS

| | | | |
|---|---|---|---|
| 4,263,374 | 4/1981 | Glass et al. | 428/693 |
| 4,316,162 | 2/1982 | Volluet et al. | 333/201 |
| 4,555,683 | 11/1985 | Sorger et al. | 333/202 |
| 4,968,954 | 11/1990 | Ryuo et al. | 331/107 A |
| 5,198,297 | 3/1993 | Tanno et al. | 333/202 X |
| 5,449,942 | 9/1995 | Tanno et al. | 257/421 |
| 5,466,388 | 11/1995 | Fujii et al. | 252/62.59 |
| 5,701,108 | 12/1997 | Fujii et al. | 333/202 |
| 5,785,752 | 7/1998 | Tanno et al. | 117/32 |
| 5,801,604 | 9/1998 | Fujino | 333/202 |

OTHER PUBLICATIONS

Patent Abstracts of Japan, vol. 095, No. 008, Sep. 29, 1995 & JP 07 130539 A (Murata Manufacturing Co., Ltd.), May 19, 1995.

Patent Abstracts of Japan, vol. 095, No. 005, Jun 30, 1995 & JP 07 050215 A (Murata Manufacturing Co., Ltd.) Feb. 21, 1995.

Database Inspec; Institute of Electrical Engineers, Stevenage, GB; Inspec No. 2975081; Beregov A.S., et al.; "Determination of the Parameters of Yttrium–iron Garnet Epitaxial Films" & Izvestiya Vysshikh Uchebnykh Zavedenii, Radio-elektronika, 1986; Ukrainian SSR, USSR, vol. 29, No. 7, ISSN 0021–3470; pp. 32–36.

Database Inspec; Institute of Electrical Engineers, Stevenage, GB; Inspec No. 4029709; Zil'berman P.E., et al.; "Nonlinear Effects in the Propagation of Surface Magnetostatic Waves in Yttrium Iron Garnet films in Weak Magnetic Fields" & Zhurnal Eksperimental'Noi I Toereticheskoi Fiziki, May 1991, USSR; vol. 99, No. 5, ISSN 0044–4510; abstract.

*Primary Examiner*—Seungsook Ham
*Attorney, Agent, or Firm*—Ostrolenk, Faber, Gerb & Soffen, LLP

[57] ABSTRACT

The magnetostatic wave device comprises a single crystal substrate made of $Gd_3Ga_5O_{12}$, a magnetic garnet single crystal film provided on the single crystal substrate and at least one transducer provided on the magnetic garnet single crystal film. The magnetic garnet single crystal film has {111} plane and is made of a material expressed by the formula $(YR_1)_3(FeR_2)_5O_{12}$, where $R_1$ is at least one element selected from La, Bi, Lu and Gd, $R_2$ is at least one element selected from Ga, Al, In and Sc and Y and Fe are the main components with respect to $R_1$ and $R_2$. In the magnetostatic wave device, a DC magnetic field is applied to the magnetic garnet single crystal film so that a magnetostatic surface wave propagates on the magnetic garnet single crystal film in a direction of <110> axis on {111} plane of the magnetic garnet single crystal film.

18 Claims, 4 Drawing Sheets

MAGNETOSTATIC WAVE DEVICE

BACKGROUND OF THE INVENTION

1. Field of the Invention

The present invention relates to a magnetostatic wave device, and more particularly, to a magnetostatic surface wave device used at a frequency of 1 GHz or less and comprising an oxide magnetic garnet single crystal.

2. Description of the Related Art

A magnetic garnet single crystal film has conventionally been used as a magnetic material for a bubble memory or an optical isolator. In addition, a magnetic garnet single crystal film has recently been applied to a microwave device, i.e., a magnetostatic wave device.

In the case of the magnetostatic wave device, a magnetic garnet single crystal film containing Fe is used, for example. Such a magnetic garnet single crystal film containing Fe is prepared by being epitaxially grown by a liquid phase epitaxial method so as to have a thickness of several tens $\mu$m on a single crystal substrate expressed by the composition formula $Gd_3Ga_5O_{12}$ (hereinafter abbreviated to a "GGG single crystal substrate"). The reason for using the GGG single crystal substrate is that it is most practical from the viewpoints of mass production and quality.

A magnetostatic wave is excited on a magnetic garnet single crystal film by applying a DC magnetic field to the magnetic garnet single crystal film and applying a high frequency magnetic field to the magnetic garnet single crystal film in a direction perpendicular to the magnetization direction. More specifically, when a DC magnetic field is applied perpendicularly or parallel with the surface of the magnetic garnet single crystal film, and a high frequency is applied to microstrip lines coupled with the magnetic garnet single crystal film, the precession of the magnetic moment occurs due to electron spins. A wave propagating through this precession is referred to as a magnetostatic wave.

The mode of the propagating magnetostatic wave is changed in accordance with the direction of the DC magnetic field applied. For example, when a DC magnetic field is applied in the direction parallel to the surface of the magnetic garnet single crystal film and perpendicular to the propagation direction of the magnetostatic surface, the internal magnetic field $H_i$ in the magnetic garnet single crystal film and the propagation frequency of the magnetostatic surface wave have the relationship expressed by the following equations (1) and (2)(Hewlett-Packard Journal Feb. 10–20, 1985):

$$f_h = \gamma(H_i + 2\pi M_s) \quad (1)$$

$$f_1 = \gamma(H_i \cdot (H_i + 4\pi M_s))^{0.5} \quad (2)$$

where $H_i = H_{ex} - 4\pi M a_a + H_a$ and f represents the frequency of the magnetostatic wave, $\gamma$ represents the gyro rotation ratio, $4\pi M_s$ represents the saturation magnetization, $H_{ex}$ represents the DC magnetic field applied from the outside, N represents the diamagnetic field coefficient, $H_a$ represents the anisotropic magnetic field, and $f_h$ and $f_1$ are respectively the upper limit and the lower limits of the propagation frequency of the magnetostatic surface wave.

The above equations (1) and (2) indicate the important relations which define the frequency band of a magnetostatic surface wave device. By using these relations, the operation frequency and frequency band of a magnetostatic surface wave device, the DC magnetic field applied from the outside, the saturation magnetization of a material and operation temperature characteristics are determined.

In order to produce a magnetostatic surface wave device on the basis of the above relations, a magnetic garnet single crystal film having a diameter of, e.g., 2 to 3 inches is first epitaxially grown on a GGG substrate having the {111} crystallographic plane (hereinafter referred to as "the plane"). The obtained magnetic garnet single crystal film also has the {111} plane, and the {111} plane is perpendicular to the <111> crystal axis (referred to as "the axis" hereinafter) which is an easy magnetization axis of the magnetic garnet single crystal film. On the thus-prepared magnetic garnet single crystal film are formed microstrip lines having a line width of, e.g., 10 $\mu$m by a method such as photolithography. The magnetic garnet single crystal film is then cut into chips. To each of the chips is mounted a magnetic circuit comprising a permanent magnet or the like. At this time, the magnetic circuit is formed so that a DC magnetic field is applied in parallel with the {111} plane and perpendicular to the <111> axis.

In the magnetic garnet single crystal film, the <111> axis has the lowest anisotropic energy and is in the state of the lowest energy level, and therefore, the easy magnetization axis of the magnetic garnet single crystal film is the <111> axis. On the other hand, the <100> axis is referred to as "the hard magnetization axis" and is in the state of the highest anisotropic energy level. These axes anisotropically affect the device characteristics.

However, neither the <111> axis nor the <100> axis exists on the <111> plane in the magnetic garnet single crystal film used in the magnetostatic wave device. Therefore, it has been thought that the magnetostatic wave device exhibits the same characteristics regardless of the direction in which a DC magnetic field is applied.

Experimental data has supported this idea. According to the results of ferromagnetic resonance measurements using a commercial electron spin resonance apparatus for measurement in the X-band (9.2 GHz) which permits measurement of magnetic anisotropy, it has confirmed that there is substantial no dependency of the horizontal resonance magnetic field on the crystal axes on the {111} plane with respect to a magnetic garnet single crystal film having the {111} plane.

Actually, it has also confirmed that, even if a DC magnetic field is applied in the direction of any low-index axis in the {111} plane, the device shows satisfactory characteristics at a frequency of 1 GHz and no difference was observed in the operation frequency and the band of the magnetostatic surface wave device regardless.

However, when the magnetostatic surface wave device is used at the frequency lower than 1 GHz, there arise some problems. Specifically, in order to lower the operation frequency of the magnetostatic surface wave device, it is necessary to reduce the applied DC magnetic field or to decrease the saturation magnetization of the material in accordance with the relations expressed by the above equations (1) and (2). Nonetheless, particularly at a frequency of less than 1 GHz, the strength of the applied DC magnetic field significantly influences the stability of magnetization. Therefore, when the applied DC magnetic field is weakened so as to set the central frequency at 1 GHz or less, specifically about 500 MHz, the magnetic garnet single crystal film is not sufficiently magnetized, which makes the characteristics of the magnetostatic surface wave device unstable and results in that a magnetostatic surface wave device for practical use cannot be obtained.

For the aforementioned reasons, there arises a demand for a magnetostatic wave device which can exhibit stable characteristics at a frequency of 1 GHz or less.

SUMMARY OF THE INVENTION

The present invention is directed to a magnetostatic wave device that satisfies this need. The magnetostatic wave device comprises a single crystal substrate made of $Gd_3Ga_5O_{12}$, a magnetic garnet single crystal film provided on the single crystal substrate and at least one transducer provided on the magnetic garnet single crystal film. The magnetic garnet single crystal film has {111} plane and is made of a material expressed by the formula $(YR_1)_3(FeR_2)_5O_{12}$, where $R_1$ is at least one element selected from La, Bi, Lu and Gd, $R_2$ is at least one element selected from Ga, Al, In and Sc, and Y and Fe are the main components with respect to $R_1$ and $R_2$. In the magnetostatic wave device, a DC magnetic field is applied to the magnetic garnet single crystal film so that a magnetostatic surface wave propagates on the magnetic garnet single crystal film in the general direction of the <110> axis on {111} plane of the magnetic garnet single crystal film.

The DC magnetic field is preferably applied to the magnetic garnet single crystal film in the direction of <112> axis on the {111} plane of the magnetic garnet single crystal film.

The magnetostatic wave device may further comprises a pair of the transducers on the magnetic garnet single crystal film and a pair of magnetostatic absorbers provided on the magnetic garnet single crystal film so as to interpose the transducers. In addition, the magnetic garnet single crystal film may be made of the material expressed by the formula $(Y_{2.97}La_{0.03})(Fe_{4.60}Ga_{0.40})O_{12}$.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
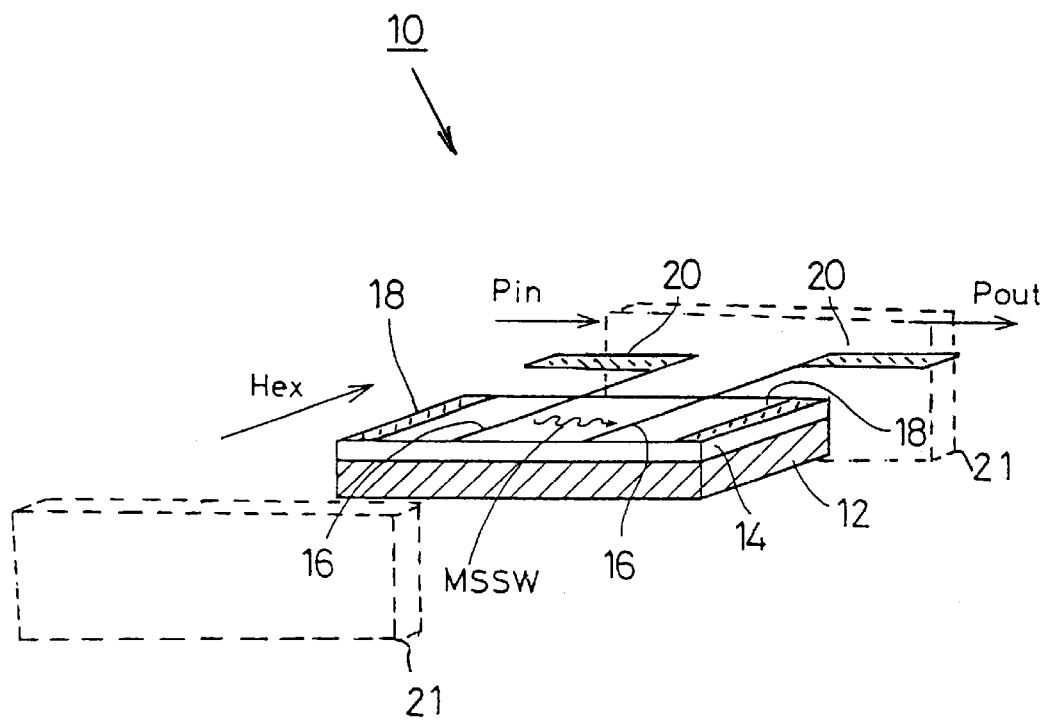
FIG. 1 is a perspective view of a magnetostatic surface wave device as an example of a magnetostatic wave device in accordance with the present invention.

A magnetostatic wave device according to the present invention comprises a $Gd_3Ga_5O_{12}$ single crystal substrate with the {111} plane and having a magnetic garnet single crystal film on the single crystal substrate. The magnetic garnet single crystal film is epitaxially grown on the single crystal substrate to have the {111} plane and made of a material expressed by the formula $(A_1R_1)_3(FeR_2)_5O_{12}$, where $R_1$ is at least one element selected from La, Bi, Lu and Gd, $R_2$ is at least one element selected from Ga, Al, In and Sc, and A, and Fe are the main components with respect to $R_1$ and $R_2$. $A_1$ is different from $R_1$ and is preferably yttrium (Y) but it may be bismuth (Bi), lutetium (Lu), gadolinium (Gd) aluminum (Al), indium (In) and/or scandium (Sc). Substantially the same results can be obtained.

Moreover, the magnetostatic wave device is so designed that a magnetostatic surface wave excited on the single crystal film propagates in the direction of the <110> axis on the {111} plane.

The inventors of the present invention studied the relationship between the crystal axis and the lowest operation frequency by changing the direction of the applied DC magnetic field applied to each of the low-index crystal axes in the plane of the single crystal film. As a result, the inventors found that the magnetostatic surface wave propagating in the direction of the <110> axis has the minimum lowest operation frequency at which the magnetostatic surface wave starts propagating on the {111} plane of the magnetic garnet single crystal film.

In addition, when the DC magnetic field applied to the magnetic garnet single crystal film in the magnetostatic surface wave device is gradually increased from zero, filter characteristics do not appear until the magnetic field reaches a certain value. This phenomenon corresponds to the fact that the magnetostatic surface wave does not propagate until the applied magnetic field has a predetermined value. This is possibly due to the phenomenon that the magnetic garnet single crystal film is not sufficiently magnetized until the magnetic field is increased to have the predetermined value. Nonetheless, the inventors have found that when the magnetostatic surface wave propagates in the direction of the <110> axis, i.e., when the DC magnetic field is applied in the direction of the <112> axis, practical filter characteristics can be obtained with high reproducibility in a lower DC magnetic field than the DC magnetic field applied in the direction of another axis.

A frequency of 1 GHz or less, more specifically, a frequency of about 500 MHz, is close to the frequency limit which allows use of a magnetic garnet crystal, and, at a such a frequency, performance as a magnetostatic surface wave device is possibly significantly influenced by a small difference in anisotropic energy. The <112> axis on the {111} plane is an axis with lower anisotropic energy than the low-index axes in other planes. In the DC magnetic field applied in the direction of the <112> axis, the magnetostatic surface wave propagates in the direction of the <110> axis on the {111} plane.

For the aforementioned reasons, the lowest operation frequency and the applied DC magnetization can be decreased by propagating the magnetostatic surface wave in the direction of the <110> axis, which can realize a magnetostatic wave device having stable characteristics at a frequency of 1 GHz or less and being obtainable with high reproducibility.

Hereinafter, the preferred embodiments of the present invention are explained in more detail with reference to the drawings.

FIG. 1 schematically shows a perspective view of a magnetostatic surface wave device as an example of a magnetostatic wave device 10 in accordance with the present invention.

The magnetostatic surface wave device 10 is used as a filter and comprises a GGG single crystal substrate 12 having a {111} plane, i.e., the (111) plane or an equivalent plane thereof. On the GGG single crystal substrate is formed a magnetic garnet single crystal film 14 having the {111} plane. The magnetic garnet single crystal film 14 is for example a thin film having a saturation magnetization of 1300 G and a thickness of 20 μm, and expressed by the intended composition formula $(Y_{2.97}La_{0.03})(Fe_{4.60}Ga_{0.40})O_{12}$.

On the magnetic garnet single crystal film 14 are formed two opposite microstrip lines 16 used as transducers and extending parallel to each other at a distance of about 5 mm. The microstrip lines 16 are made of aluminum, and each have a width of 50 μm. A DC magnetic field $H_{ex}$ is applied to the magnetic garnet single crystal film 14 in parallel to the magnetic garnet single crystal film 14 and the microstrip lines 16. The DC magnetic field $H_{ex}$ may be generated by a magnetic generation means such as a pair of ferrite magnets 21. The direction of the DC magnetic field $H_{ex}$ and the direction in which the microstrip lines 16 extend are parallel to the direction of the <112> axis, i.e., [112] axis or an equivalent axis thereof. In this case, the magnetostatic surface wave launched by the microstrip lines 16 propagates in the direction of <110> axis, i.e., the [110] axis or an equivalent axis thereof, which is perpendicular to the direction of the DC magnetic field $H_{ex}$. That is, the DC magnetic field $H_{ex}$ is selected such that the magnetostatic surface wave excited on the magnetic garnet single crystal film 14 propagates in the direction of <110> axis. Each of the microstrip lines 16 is connected to an external transducer 20 so that one of them is used for inputting high frequency signals, the other being used for outputting. At both ends of the magnetic garnet single crystal film 14 in the propagation direction of the magnetostatic wave are respectively formed magnetostatic absorbers 18 for absorbing unnecessary magnetostatic waves.

The method of producing the magnetostatic surface wave device 10 is described below.

A single crystal ingot expressed by the composition formula $Gd_3Ga_5O_{12}$ is first cut in the (111) plane, and then polished to prepare a single crystal substrate 12 having the (111) plane.

Meanwhile, composition raw materials $Y_2O_3$=0.40 mol %, $Fe_2O_3$=9.24 mol %, $La_2O_3$=0.06 mol %, $Ga_2O_3$=0.30 mol %, PbO=84.00 mol %, and $B_2O_3$=6.00 mol % are mixed. The resultant mixture is then heated to about 1200° C. to form a melt. The thus-formed melt is then cooled to 890° C. and allowed to stand. In the melt is dipped the $Gd_3Ga_5O_{12}$ single crystal substrate of 2 inch diameter having the (111) plane to grow the magnetic garnet single crystal film 14 having the intended composition formula $(Y_{2.97}La_{0.03})(Fe_{4.60}GaO_{0.40})O_{12}$ in the (111) plane by a horizontal dipping method, thereby preparing the GGG single crystal substrate 12 with a magnetic garnet single crystal film 14 having the (111) plane. On the magnetic garnet single crystal film 14 are formed the microstrip lines 16 by photolithography. The magnetostatic absorbers 18 are further formed on the magnetic garnet single crystal thin film 14. Then the single crystal substrate 12 is cut into chips having a size of 10.0 mm long and 2.5 mm wide. To the microstrip lines 16 are respectively connected the external transducers 20 to obtain the magnetostatic surface wave device 10.

Figure 2:
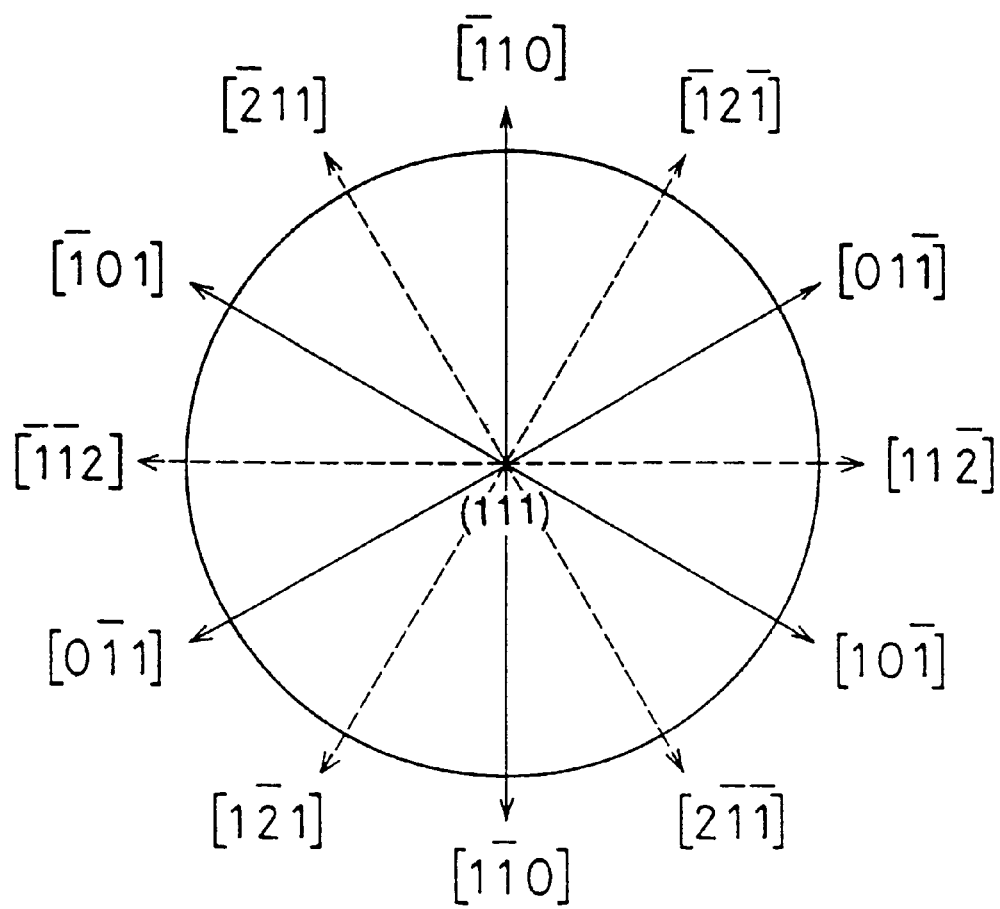
FIG. 2 is a chart showing the positional relation of the low-index axes present in the (111) plane of a magnetic garnet crystal.

FIG. 2 is a chart showing the positional relation of the low-index axes on the (111) plane of a magnetic garnet crystal. It is noted that the [$\bar{1}$10], [1$\bar{1}$0], [$\bar{1}$01], [10$\bar{1}$], [0$\bar{1}$1] and [01$\bar{1}$] axes are equivalent to the [110] axis and can be collectively denoted as the <110> axis. Also, the [$\bar{2}$11], [2$\bar{1}\bar{1}$], [$\bar{1}\bar{1}$2], [11$\bar{2}$], [1$\bar{2}$1] and [$\bar{1}$2$\bar{1}$] axes are equivalent to the [112] axis and can be collectively denoted as the <112> axis. Although, the <123> axis exists as a low-index axis on the (111) plane in addition to the <110> axis and the <112> axis, this axis is omitted here.

In this embodiment, in order to examine the relation between the crystal axis and the propagation direction of the magnetostatic surface wave, two other types of magnetostatic surface wave devices 10 having different propagation directions of magnetostatic waves were prepared. Specifically, a magnetostatic surface wave device 10 in which the magnetostatic wave propagates in the direction of the <110> axis, a magnetostatic surface wave device in which the magnetostatic wave propagates in the direction of the <112> axis, and a magnetostatic surface wave device in which the magnetostatic wave propagates in the direction of the <123> axis were prepared by the above production method.

Figure 3:
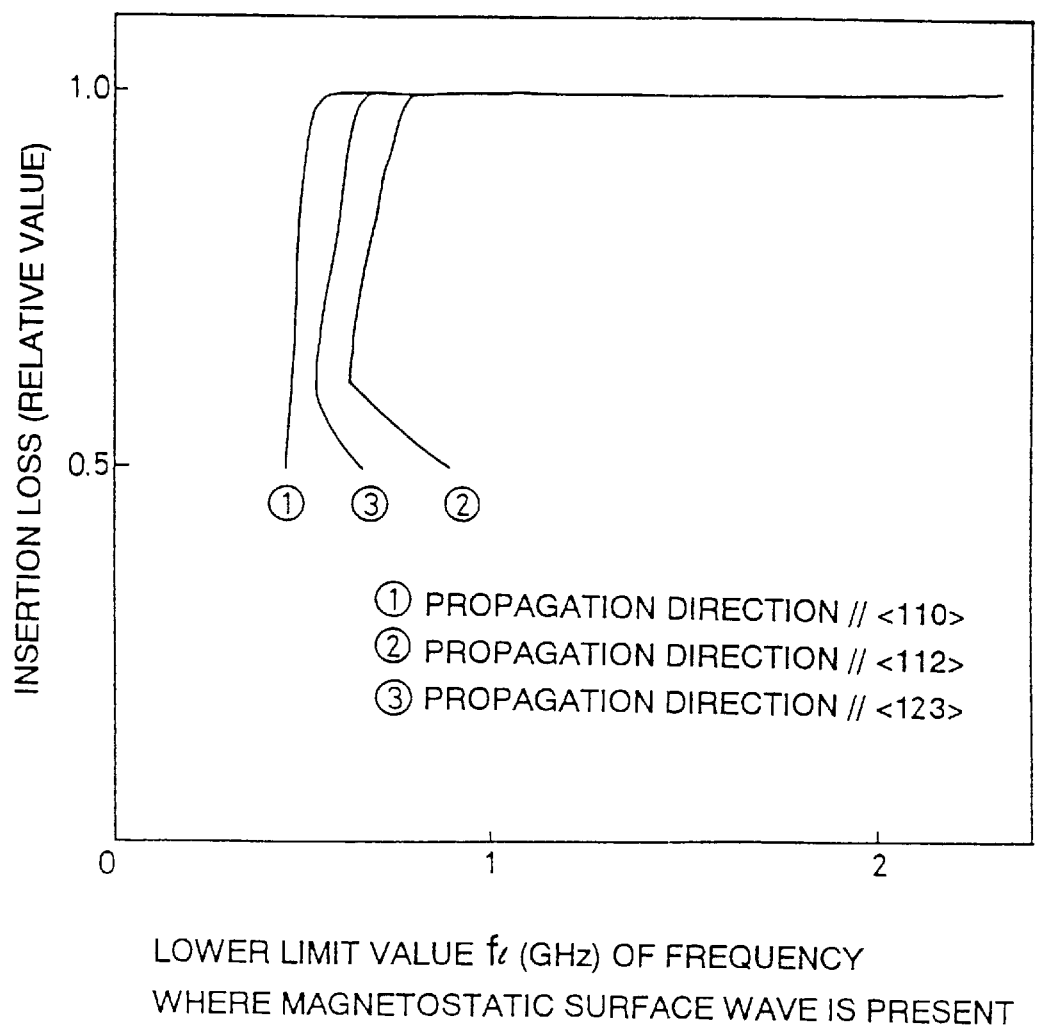
FIG. 3 is a graph showing the relationship between the lower limit $f_1$ of propagation frequency of a magnetostatic surface wave and insertion loss (relative value) when a magnetostatic surface wave was propagated in parallel with each of the <110> axis, the <112> axis and the <123> axis while a DC magnetic field was changed by using an electromagnet.
Figure 4:
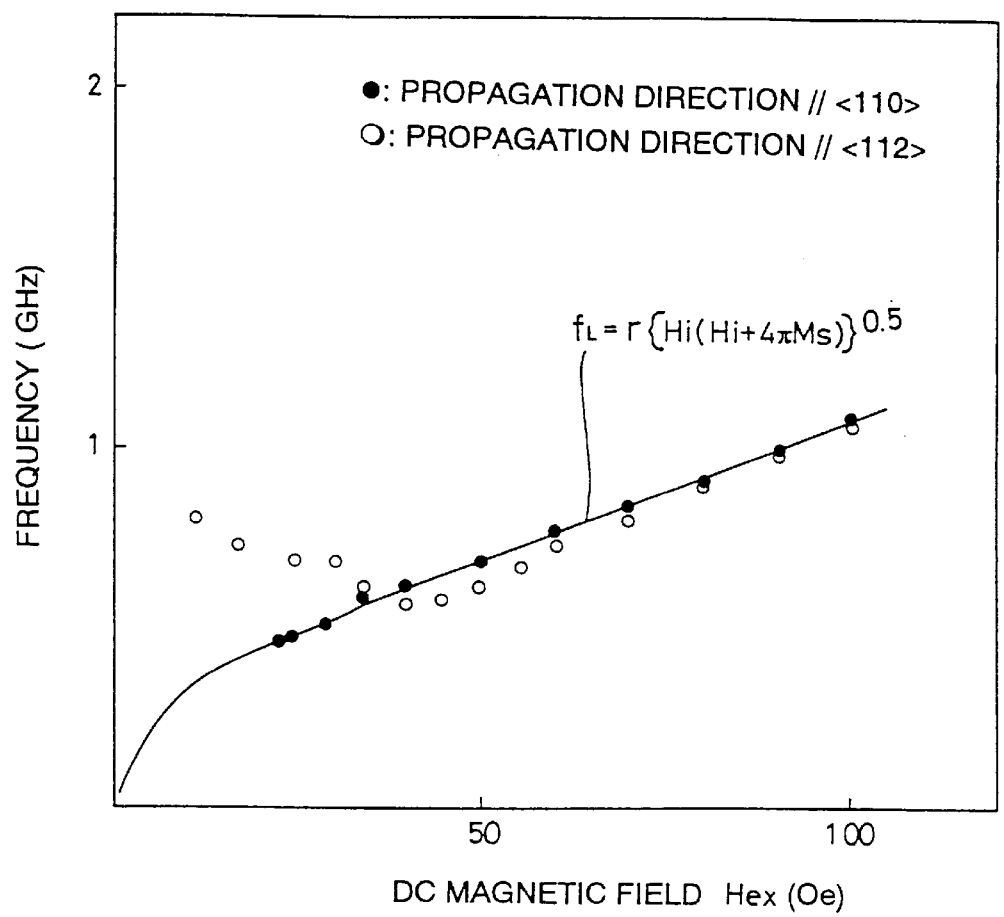
FIG. 4 is a graph showing the relation between the DC magnetic field and the lower limit $f_1$ of propagation frequency of a magnetostatic surface wave when a magnetostatic surface wave was propagated in parallel with the <110> axis and the <112> axis.

The results of investigation performed by propagating the magnetostatic wave in each of the axes on the (111) plane will be described below with reference to FIGS. 3 and 4. FIG. 3 is a graph showing the relation between the lower limit value $f_1$ of the propagation frequency of a magnetostatic wave and insertion loss (relative value) when the magnetostatic surface wave was propagated in parallel with each of the <110> axis, <112> axis and <123> axis. FIG. 4 is a graph showing the relationship between the DC magnetic field and the lower limit value $f_1$ of the propagation frequency of a magnetostatic wave when the magnetostatic surface wave was propagated in parallel with the <110> axis and <112> axis. In FIG. 4, the solid line is a line obtained by plotting the theoretical values determined from equation (2).

As shown in FIG. 3, the magnetostatic surface wave propagating in the direction of the <110> axis can exist at the lowest frequency. According to FIG. 3, the magnetostatic surface wave can even exist at about 500 MHz without substantial insertion loss when the <110> axis is selected as the direction in which the magnetostatic surface wave propagates.

As shown in FIG. 4, when the magnetostatic surface wave propagates in the direction of the <112> axis, filter characteristics are exhibited at the time a DC magnetic field of 10 (Oe) is applied. However, in order that the filter characteristics reach the practical level, it is necessary to apply a DC magnetic field of 40 (Oe). In the range of magnetic fields of less than 40 (Oe), as shown in FIG. 4, filter characteristics exhibiting behavior different from theoretical behavior supposed from the equation (2) were observed. Therefore, practical characteristics were not obtained until filter characteristics at a central frequency of 600 MHz or more, which can be obtained by applying a DC magnetic field of substantially 40 (Oe) or more, were observed.

On the other hand, when the magnetostatic surface wave was propagated in parallel with the <110> axis, filter characteristics were not observed until a DC magnetic field of 24 (Oe) was applied. However, the filter characteristics reached the practical level immediately when the DC magnetic field of 24 (Oe) was applied. Namely, unlike in propagation in the direction of the <112> axis, in propagation in the direction of the <110> axis, filter characteristics corresponding to the equation (2) were obtained after filter characteristics were exhibited, and practical filter characteristics were obtained at a frequency from about 500 MHz, as shown in FIG. 4. Also the reproducibility of the filter characteristics was excellent.

When the magnetostatic surface wave propagates in parallel with the <123> axis, the obtained results were intermediate between the filter characteristics obtained in the directions of the <110> axis and the <112> axis.

As is apparent from the above explanation, the lowest operation frequency and the applied DC magnetization can be decreased by propagating the magnetostatic surface wave in the direction of the <110> axis. Therefore, it is possible to realize a magnetostatic wave device having stable characteristics at a frequency of 1 GHz or less and being obtainable with high reproducibility.

Although the magnetostatic wave device shown in FIG. 1 has the structure for a filter, the present invention may also be applied to a magnetostatic wave device for an S/N enhancer.

Figure 5:
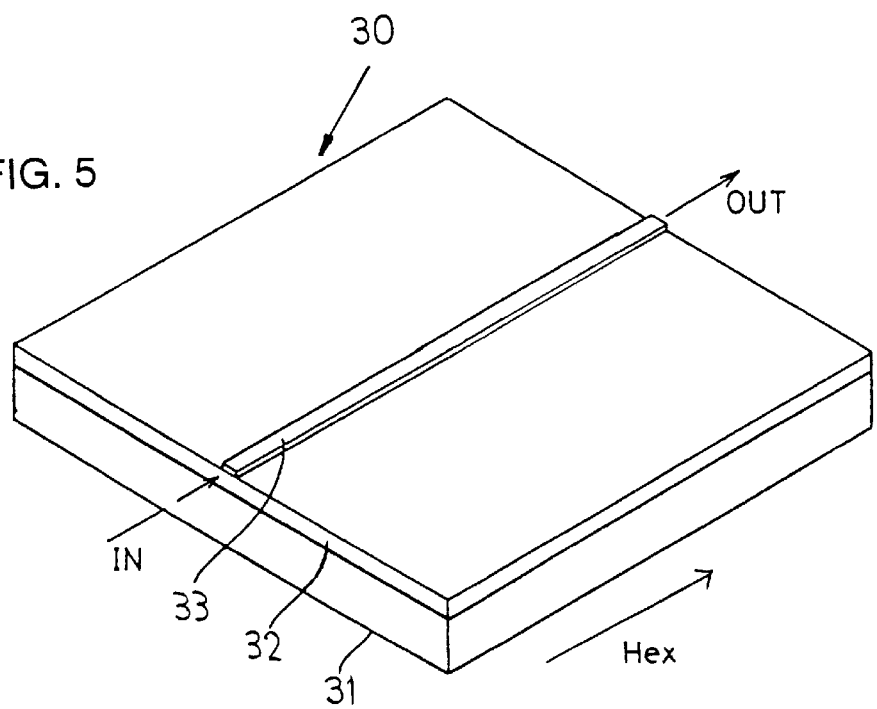
FIG. 5 is a perspective view of a magnetostatic surface wave device as another example of a magnetostatic wave device in accordance with the present invention.

FIG. 5 shows one example of magnetostatic wave devices for an S/N enhancer. A magnetostatic wave device 30 comprises a GGG single crystal substrate 31, a magnetic garnet single crystal film 32 formed on the GGG single crystal substrate 31 and a microstrip line 33 on the GGG single crystal substrate 31. The GGG single crystal substrate 31 and the magnetic garnet single crystal film 32 have the (111) plane and the same properties as explained with reference to FIG. 1. The microstrip line 33 extends in the direction of the [112] axis. A DC magnetic field $H_{ex}$ is applied to the magnetic garnet single crystal film 32 in the direction of the [112] axis which is parallel to the magnetic garnet single crystal film 32 and the microstrip line 33.

The microstrip line 33 is used as a transducer. When a signal is input to one end of the microstrip line 33, a magnetostatic surface wave is excited on the magnetic garnet single crystal film 32 and propagates in the direction of the <110> axis and perpendicular to the direction of the DC magnetic field $H_{ex}$. When the input signal has a small power, the signal output from the other end of the microstrip line 33 becomes very small as the most of the input signal is converted into the magnetostatic surface wave. On the contrary, when a large power signal is input to the microstrip 33, most of the signal is output as the conversion of the input signal to the magnetostatic surface wave is saturated. In this way, the magnetostatic wave device works as a S/N enhancer which prevents noise components having a small power from being transmitted to the output. The magnetostatic wave device 30 according to the present invention is superior in suppressing the noise components at the frequency of less than 1 GHz, specifically, from about 500 MHz.

While preferred embodiments of the invention have been disclosed, various modes of carrying out the principles disclosed herein are contemplated as being within the scope of the invention.

What is claimed is:

1. A magnetostatic wave device comprising:
    a single crystal $Gd_3Ga_5O_{12}$ substrate;
    a magnetic garnet single crystal film on the single crystal substrate, the magnetic garnet single crystal film having {111} plane and being of a material expressed by the formula $(A_1R_1)_3(FeR_2)_5O_{12}$, where $A_1$ is at least one member selected from the group consisting of Y, Bi, Lu, Gd, Al, In and Se, $R_1$ is different from $A_1$ and is at least one element selected from the group consisting of La, Bi, Lu and Gd, $R_2$ is at least one element selected from the group consisting of Ga, Al, In and Sc and wherein the molar content of $A_1$ in $A_1R_1$ is greater than $R_1$ and the molar content of Fe in $FeR_2$ is greater than $R_2$;
    at least one transducer provided on the magnetic garnet single crystal film; and
    a DC magnetic field source adapted to apply a magnetic field to the magnetic garnet single crystal film such that a magnetostatic surface wave launched by the transducer propagates on the magnetic garnet single crystal film in the <1 10> axis direction on {111} plane of the magnetic garnet single crystal film, wherein the operation frequency is at least about 1 GHz or less.

2. A magnetostatic wave device according to claim 1, wherein the DC magnetic field source is adapted to apply the magnetic field to the magnetic garnet single crystal film in the <112> axis direction on the {111} plane of the magnetic garnet single crystal film.

3. A magnetostatic wave device according to claim 2, wherein $A_1$ comprises Y.

4. A magnetostatic wave device according to claim 3, wherein $R_1$ comprises La and $R_2$ comprises Ga.

5. A magnetostatic wave device according to claim 4, wherein the single crystal $Gd_3Ga_5O_{12}$ substrate has the {111} plane.

6. A magnetostatic wave device according to claim 5, having a second transducer on the magnetic garnet single crystal film and a pair of magnetostatic absorbers on the magnetic garnet single crystal film so as to interpose the two transducers.

7. A magnetostatic wave device according to claim 6, wherein the magnetic garnet single crystal film is of the material expressed by the formula $(Y_{2.97}La_{0.03})(Fe_{4.60}Ga_{0.40})O_{12}$.

8. A magnetostatic wave device according to claim 7, wherein the operation frequency is at least about 500 MHz.

9. A magnetostatic wave device according to claim 1, wherein $A_1$ comprises Y.

10. A magnetostatic wave device according to claim 9, wherein $R_1$ comprises La and $R_2$ comprises Ga.

11. A magnetostatic wave device according to claim 10, wherein the single crystal $Gd_3Ga_5O_{12}$ substrate has the {111} plane.

12. A magnetostatic wave device according to claim 11, having a second transducer on the magnetic garnet single crystal film and a pair of magnetostatic absorbers on the magnetic garnet single crystal film so as to interpose the two transducers.

13. A magnetostatic wave device according to claim 12, wherein the magnetic garnet single crystal film is of the material expressed by the formula $(Y_{2.97}La_{0.03})(Fe_{4.60}Ga_{0.40})O_{12}$.

14. A magnetostatic wave device according to claim 1, having a second transducer on the magnetic garnet single crystal film and a pair of magnetostatic absorbers on the magnetic garnet single crystal film so as to interpose the two transducers.

15. A magnetostatic wave device according to claim 14, wherein the magnetic garnet single crystal film is of the material expressed by the formula $(Y_{2.97}La_{0.03})(Fe_{4.60}Ga_{0.40})O_{12}$.

16. A magnetostatic wave device according to claim 1, wherein the magnetic garnet single crystal film is of the material expressed by the formula $(Y_{2.97}La_{0.03})(Fe_{4.60}Ga_{0.40})O_{12}$.

17. A magnetostatic wave device according to claim 1, having a DC magnetic field and a frequency of less than 1 GHz applied thereto.

18. A magnetostatic wave device according to claim 16, having a frequency of at least about 500 MHz applied thereto.

* * * * *